(12) United States Patent
Yang et al.

(10) Patent No.: US 10,051,742 B2
(45) Date of Patent: Aug. 14, 2018

(54) POWER MODULE AND MANUFACTURING METHOD THEREOF

(71) Applicant: Industrial Technology Research Institute, Hsinchu (TW)

(72) Inventors: Shu-Jung Yang, Tainan (TW); Yu-Lin Chao, Hsinchu (TW); Heng-Chieh Chien, New Taipei (TW); Chun-Kai Liu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/964,575

(22) Filed: Dec. 10, 2015

(65) Prior Publication Data
US 2017/0171978 A1 Jun. 15, 2017

(51) Int. Cl.
*H05K 1/18* (2006.01)
*H01L 29/02* (2006.01)
*H05K 3/46* (2006.01)

(52) U.S. Cl.
CPC .......... *H05K 1/185* (2013.01); *H01L 29/02* (2013.01); *H05K 1/186* (2013.01); *H05K 3/4605* (2013.01);
(Continued)

(58) Field of Classification Search
CPC ..................... H05K 1/185; H05K 2201/10
(Continued)

(56) References Cited

U.S. PATENT DOCUMENTS

| 6,400,573 B1 * | 6/2002 | Mowatt | H01L 23/5383 174/252 |
| 7,449,774 B1 | 11/2008 | Jeun et al. | |

(Continued)

FOREIGN PATENT DOCUMENTS

| CN | 101241901 | 8/2008 |
| TW | 200612522 | 4/2006 |

(Continued)

OTHER PUBLICATIONS

Mouawad et al., "3-Dimensional, Solder-Free Interconnect Technology for high-Performance Power Modules", 2012 7th International Conference on Integrated Power Electronics Systems (CIPS), Mar. 6-8, 2012, pp. 1-6.

(Continued)

*Primary Examiner* — Binh Tran
(74) *Attorney, Agent, or Firm* — JCIPRNET (57) ABSTRACT

A power module and a manufacturing method thereof are provided, and the power module includes a carrier substrate, an interconnection layer, a first chip, a second chip, a ceramic bonding substrate, a top interconnection layer and a lead frame. The interconnection layer is disposed on the carrier substrate. The first chip and the second chip are disposed on the interconnection layer, and electrically connected to the interconnection layer. The ceramic bonding substrate is disposed on the interconnection layer, and is disposed in between the first chip and the second chip so as to separate the first chip from the second chip. The top interconnection layer is disposed on the ceramic bonding substrate, covers the first chip and the second chip, and is electrically connected to the first chip and the second chip. The lead frame is disposed on the top interconnection layer and electrically connected to the top interconnection layer.

15 Claims, 6 Drawing Sheets

(52) U.S. Cl.
CPC ............... *H05K 2201/10* (2013.01); *H05K 2201/10166* (2013.01)

(58) Field of Classification Search
USPC .................................................. 361/761–764
See application file for complete search history.

(56) References Cited

U.S. PATENT DOCUMENTS

| | | |
|---|---|---|
| 7,846,779 B2 | 12/2010 | Yang |
| 8,563,358 B2 | 10/2013 | Landesberger et al. |
| 8,604,611 B2 | 12/2013 | Hauenstein |
| 8,723,311 B2 | 5/2014 | Stella |
| 2013/0140684 A1 | 6/2013 | Hauenstein |
| 2013/0328200 A1 | 12/2013 | Bae |

FOREIGN PATENT DOCUMENTS

| | | |
|---|---|---|
| TW | I353650 | 12/2011 |
| TW | 201234945 | 8/2012 |
| TW | 201248949 | 12/2012 |
| TW | 201343013 | 10/2013 |
| TW | 201409660 | 3/2014 |
| TW | I455286 | 10/2014 |

OTHER PUBLICATIONS

Zeltner et al., "An Isolating IGBT Halfbridge Driver with Embedded Magnetics", PCIM Power Electronics Conference, 2004, pp. 168-173.

Olesen et al., ""Power under the hood" Increasing power density of inverters with a novel 3D-approach", APE, Mar. 25-26, 2009, pp. 1-6.

Boettcher et al., "Embedding of Chips for System in Package realization", Microsystems, Packaging, Assembly & Circuits Technology Conference, 2008. Impact 2008. 3rd International, Oct. 22-24, 2008, pp. 383-386.

"Office Action of Taiwan Counterpart Application", dated Aug. 12, 2016, p. 1-p. 8.

\* cited by examiner

POWER MODULE AND MANUFACTURING METHOD THEREOF

TECHNICAL FIELD

The disclosure relates to a power module and manufacturing method thereof, related to a power module having a small form factor and good heat dissipation ability, and its manufacturing method thereof.

BACKGROUND

In recent years, the rapid progress of the fabricating techniques of integrated circuits (ICs) leads to great improvements in the functions of electronic devices. However, with the enhancement of the processing speed and performance of the electronic devices, the heat generated when the electronic devices are working also increases. If the waste heat cannot be effectively dissipated, an electronic device failure may occur, or the electronic devices may not achieve the good performance. The structure of small power modules such as integrated intelligent power modules (IPM) are made through the combination of wires, lead frame and through mold processing. Furthermore, in such a structure, the bare copper on the direct bond copper (DBC) substrate is generally used for heat dissipation. However, power modules still have the disadvantages of a large volume and poor heat dissipation in the device. Therefore, how to improve the design of current power modules to make it thinner and to have improved dissipation ability has become a topic of research.

SUMMARY

The power module of the disclosure includes a carrier substrate, an interconnection layer, a first chip, a second chip, a ceramic bonding substrate, a top interconnection layer and a lead frame. The interconnection layer is disposed on the carrier substrate. The first chip and the second chip are disposed on the interconnection layer, wherein the first chip and the second chip are electrically connected to the interconnection layer. The ceramic bonding substrate is disposed on the interconnection layer and disposed in between the first chip and the second chip so as to separate the first chip from the second chip. The top interconnection layer is disposed on the ceramic bonding substrate and covers the first chip and the second chip. The top interconnection layer is electrically connected to the first chip and the second chip. The lead frame is disposed on the top interconnection layer and electrically connected to the top interconnection layer. A molding material layer is disposed on the lead frame.

The manufacturing method of a power module of the disclosure includes forming an interconnection layer on a carrier substrate. Disposing a first chip and a second chip on the interconnection layer, wherein the first chip and the second chip are electrically connected to the interconnection layer. Forming a ceramic bonding substrate on the interconnection layer, wherein the ceramic bonding substrate is disposed in between the first chip and the second chip so as to separate the first chip from the second chip. Forming a top interconnection layer on the ceramic bonding substrate and covering the first chip and the second chip, wherein the top interconnection layer is electrically connected to the first chip and the second chip. Forming a lead frame on the top interconnection layer, wherein the lead frame is electrically connected to the top interconnection layer. And, forming a molding material on the lead frame to form a molding material layer, and performing a mold cutting process of the molding material so as to form the power module.

Several exemplary embodiments accompanied with figures are described in detail below to further describe the disclosure in details.

BRIEF DESCRIPTION OF THE DRAWINGS

The accompanying drawings are included to provide a further understanding, and are incorporated in and constitute a part of this specification. The drawings illustrate embodiments and, together with the description, serve to explain the principles of the disclosure.

DESCRIPTION OF THE EMBODIMENTS

Reference will now be made in detail to the exemplary embodiments, examples of which are illustrated in the accompanying drawings. Wherever possible, the same reference numbers are used in the drawings and the description to refer to the same or like parts.

The disclosure is directed to a power module and its manufacturing method thereof, wherein the power module can become thinner and have good heat dissipation ability at the same time.

The power module and its manufacturing method thereof use a ceramic boding substrate to isolate the chips and to provide insulation of voltage. Further, the ceramic material with good heat transfer characteristic is used to dissipate the heat from the chip, and an interconnection layer is used to transmit electrical signals. As such, the power module can be made thinner, hence enabling the heat and electrical transmission distance to be shortened, and a heat dissipation ability of the power module is improved.

FIG. 1A to FIG. 1F are schematic cross-sectional diagrams of a manufacturing process of a power module according to an embodiment of the disclosure. Firstly, referring to FIG. 1A, the manufacturing method of a power module of the embodiment includes providing a carrier substrate 100. The material of the carrier substrate 100 includes ceramic, quartz, glass, diamond (e.g., diamond like carbon, DLC) or other material having insulating characteristics, but is not limited thereto. The ceramic material includes aluminum oxide ($Al_2O_3$), gallium nitride (GaN), silicon carbide (SiC), aluminum nitride (AlN) or beryllium oxide (BeO). In the next step, an interconnection layer 200 is formed on the carrier substrate 100. The interconnection layer 200 includes an insulating layer 210 and a conductive patterned structure 220 located within the insulating layer 210. The conductive patterned structure 220 is, for example, copper, tungsten or other metals or alloy or materials having good thermal conductivity characteristics and so forth. In addition, in the embodiment, the surface of the interconnection layer 200 is provided with a metal bonding pattern 230.

Figure 1A:
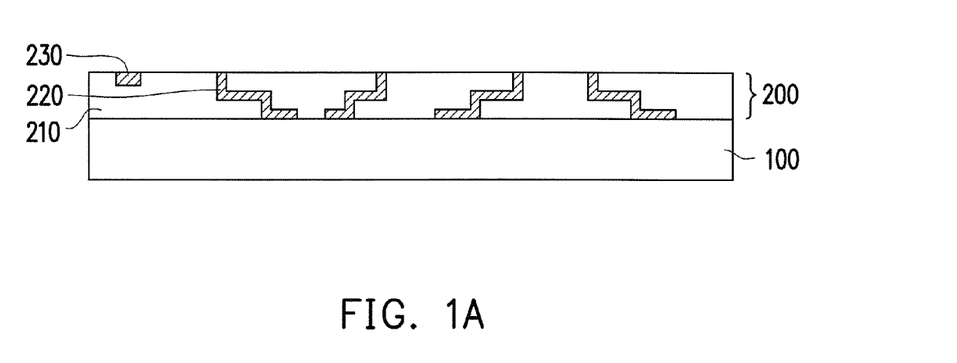
FIG. 1A to FIG. 1F are schematic cross-sectional diagrams of a manufacturing process of a power module according to an embodiment of the disclosure.

More specifically, the method of forming the interconnection layer 200 is, for example, performing at least one metal interconnection manufacturing process. The metal interconnection manufacturing process includes forming a patterned insulating material by sequentially performing a deposition process of an insulating material, a lithography process, and an etching or laser drilling process; and then filling a metal material into the patterned insulating material. The metal interconnection manufacturing process was repeated several times so as to form the interconnection structure (e.g., the interconnection layer 200 shown in FIG. 1). Furthermore, the metal bonding pattern 230 of the embodiment can be defined in the metal interconnection manufacturing process as described above.

Figure 1B:
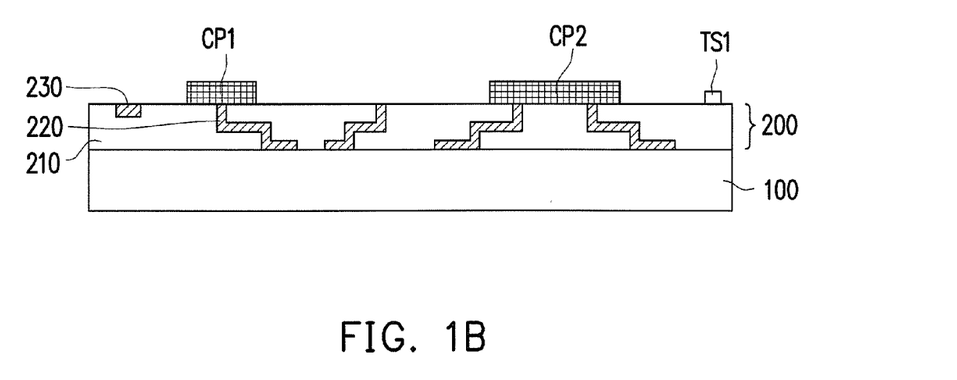

Next, please refer to FIG. 1B, a first chip CP1 and second chip CP2 are disposed on the interconnection layer 200, wherein the first chip CP1 and the second chip CP2 are electrically connected to the interconnection layer 200. More specifically, the conductive patterned structure 220 of the interconnection layer 200 extends from a position where the first chip CP1 and the second chip CP2 are disposed to another position that does not overlap with the position of the first chip CP1 and the second chip CP2. That is, the conductive patterned structure 220 extends to an outer side of a chip coverage area (footprint) of the first chip CP1 and the second chip CP2, such that the interconnection layer 200 is used as a redistribution layer. Therefore, the structure formed by the chips and interconnection layer of the embodiment is also known as a "Fan Out" structure. Such a structure can provide a contact point for the connection to external electrodes, and can be used to improve the packaging yield as well as reducing a short-circuit problem caused by having the contact points of the chip electrodes being too close.

The first chip CP1 and the second chip CP2, for example, includes diodes, or insulated-gate bipolar transistors (IGBT), metal-oxide semiconductor field-effect transistor (MOSFET), and other power devices for a chip, and so forth. Therefore, the chip has top and bottom electrodes, but is not limited thereto. Furthermore, in the embodiment, a temperature sensor TS1 or driving chips that are in other power modules may be optionally disposed on the interconnection layer 200.

Figure 1C:
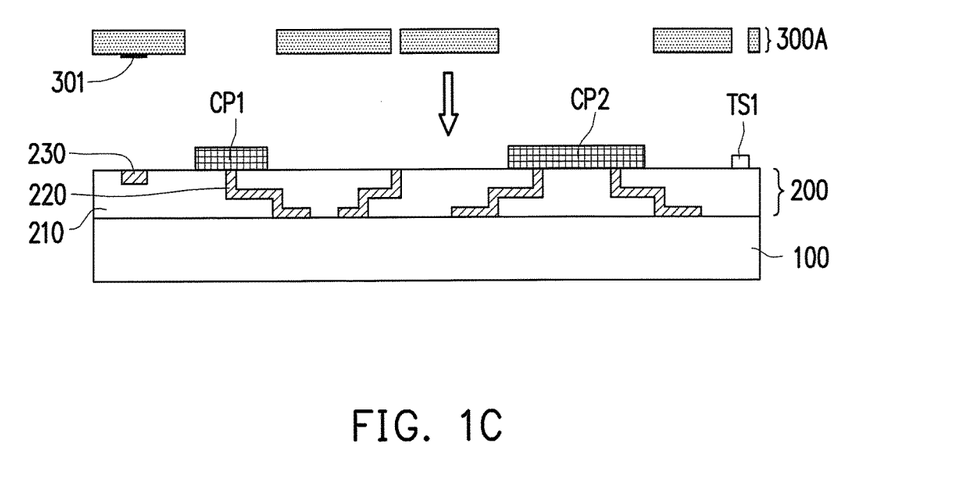

Next, please refer to FIG. 1C, a ceramic bonding substrate 300A is provided, wherein the ceramic bonding substrate 300A has specific opening patterns. The specific opening patterns are predetermined for disposing chips, sensors or other structures. The material of the ceramic bonding substrate 300A includes highly thermal conductive electrically insulating materials such as $Al_2O_3$, GaN, SiC, AlN, BeO, and so forth, but is not limited thereto. In addition, a bottom surface of the ceramic bonding substrate 300A is partially disposed with a metal bonding layer 301. A material of the metal bonding layer 301 is, for example, a material that may be connected to the metal bonding pattern 230. For instance, if copper is used as the metal bonding pattern 230, then copper may also be selected as the material of the metal bonding layer 301.

Figure 1D:
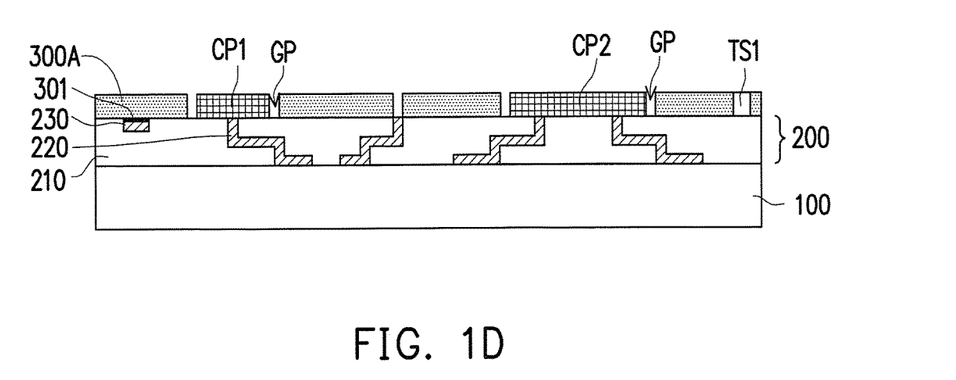

Please refer to FIG. 1D, the ceramic bonding substrate 300A is disposed on the interconnection layer 200, wherein a connection is provided to the metal bonding pattern 230 of the interconnection layer 200 through the metallic bonding layer 301 of the ceramic bonding substrate 300A. After connecting the ceramic bonding substrate 300A with the interconnection layer 200, the ceramic bonding substrate 300A is disposed in between the first chip CP1 and the second chip CP2, so as to separate the first chip CP1 from the second chip CP2. In the one embodiment, a gap GP exists in between the first chip CP1 and the ceramic bonding substrate 300A, and in between the second chip CP2 and the ceramic bonding substrate 300A, respectively.

Figure 1E:
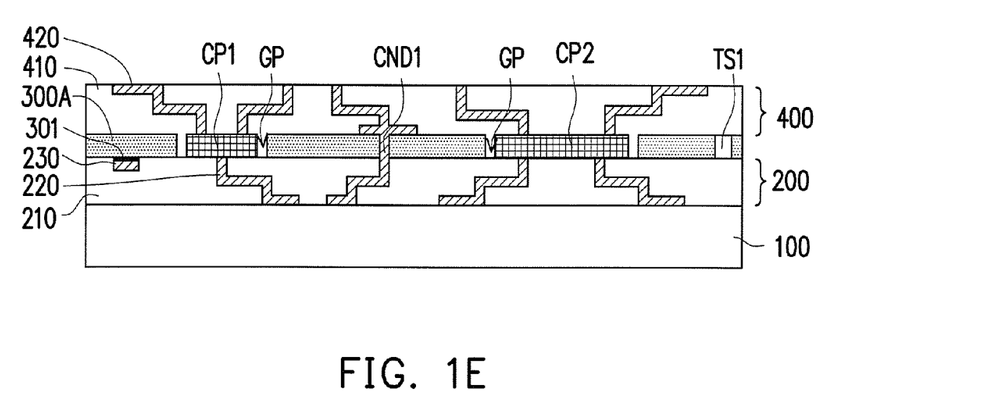

Furthermore, referring to FIG. 1E, a top interconnection layer 400 is formed on the ceramic bonding substrate 300A, the top interconnection layer 400 covers the first chip CP1 and the second chip CP2, wherein the top interconnection layer 400 is electrically connected to the first chip CP1 and the second chip CP2. The top interconnection layer 400 includes an insulating layer 410 and a conductive patterned structure 420 located within the insulating layer 410. The method of forming the top interconnection layer 400 is, for example, performing at least one metal interconnection manufacturing process. The metal interconnection manufacturing process includes filling metal materials on the ceramic bonding substrate 300A and sequentially performing a deposition process of an insulating material, a lithography process, an etching or laser drilling process to form a patterned insulating material; and then filling a metal material into the patterned insulating material. The metal interconnection manufacturing process was repeated several times so as to form the interconnection structure (e.g., the interconnection layer 200 shown in FIG. 1).

In the one embodiment, the gap GP exists in between the first chip CP1 and the ceramic bonding substrate 300A and in between the second chip CP2 and the ceramic bonding substrate 300A respectively, therefore, during the process of forming the top interconnection layer 400, the insulating layer 410 will be filled into the gap GP. More specifically, in order to reduce the thermal stress caused by the thermal expansion coefficient mismatch, the insulating layer 410 can be selected from a material having elasticity. As such, during the formation process of the top interconnection layer 400, the insulating layer 410 can be filled into the gap GP located in between an edge of each chip (CP1, CP2) and a sidewall of an opening of the ceramic bonding substrate 300A. Moreover, in the one embodiment, the process of forming the top interconnection layer 400 further comprises forming a conductive structure CND1 within the ceramic bonding substrate 300A. The conductive structure CND1 is electrically connected to the interconnection layer 200 and the top interconnection layer 400 respectively.

Figure 1F:
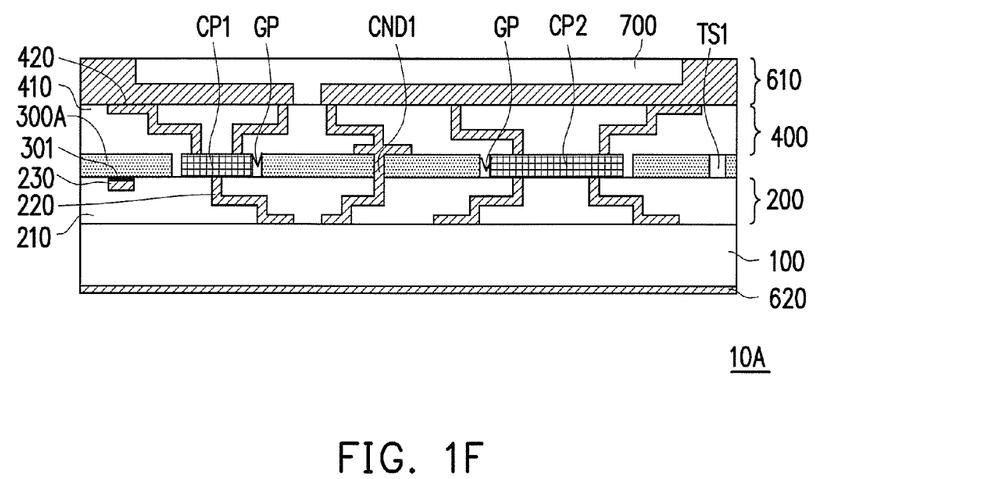

Referring to FIG. 1F, a lead frame 610 is formed on the top interconnection layer 400, wherein the lead frame 610 is electrically connected to the top interconnection layer 400. After completing the above process, a molding material is formed on the lead frame 610 to form a molding material layer 700 and a mold cutting process of the molding material is performed so as to form the power module of the embodiment. Furthermore, in the one embodiment, a heat dissipation metal layer 620 (for example, copper) may be coated on a bottom surface of the carrier substrate 100 so as to further improve the heat dissipation effect of the power module.

In the one embodiment, the first chip CP1 and the second chip CP2 are fixed within the opening of the ceramic bonding substrate 300, and the gap GP may be completely filled by the insulating layer 410. Therefore, a shift in the position of the chips can be prevented during the manufacturing process, and by having wireless structure, this will allow the power module to be made thinner, such that the heat and electrical transmission distance can be shortened, and a heat dissipation ability of the power module improved.

Accordingly, by referring to the process described in FIG. 1A to FIG. 1G, a structure of a power module 10A according to one embodiment of the disclosure can be achieved.

Briefly, as shown in FIG. 1F, the power module 10A of the embodiment includes a carrier substrate 100, an interconnection layer 200, a first chip CP1, a second chip CP2, a ceramic bonding substrate 300A, a top interconnection layer 400, a lead frame 610, a heat dissipation metal layer 620 and a molding material layer 700. More specifically, the interconnection layer 200 is disposed on the carrier substrate 100. The first chip CP1 and second chip CP2 are disposed on the interconnection layer 200, wherein the first chip CP1 and the second chip CP2 are electrically connected to the interconnection layer 200. The ceramic bonding substrate 300A is disposed on the interconnection layer 200 and is disposed in between the first chip CP1 and the second chip CP2 so as to separate the first chip CP1 from the second chip CP2. The top interconnection layer 400 is disposed on the ceramic bonding substrate 300A and covers the first chip CP1 and second chip CP2, wherein the top interconnection layer 400 is electrically connected to the first chip CP1 and the second chip CP2. The lead frame 610 is disposed on the top interconnection layer 400 and is electrically connected to the top interconnection layer 400. The molding material layer 700 is disposed on the lead frame 610. In addition, the same manufacturing process may be used to provide further stacked layers to the above structure to form a 3D structure.

Figure 2A:
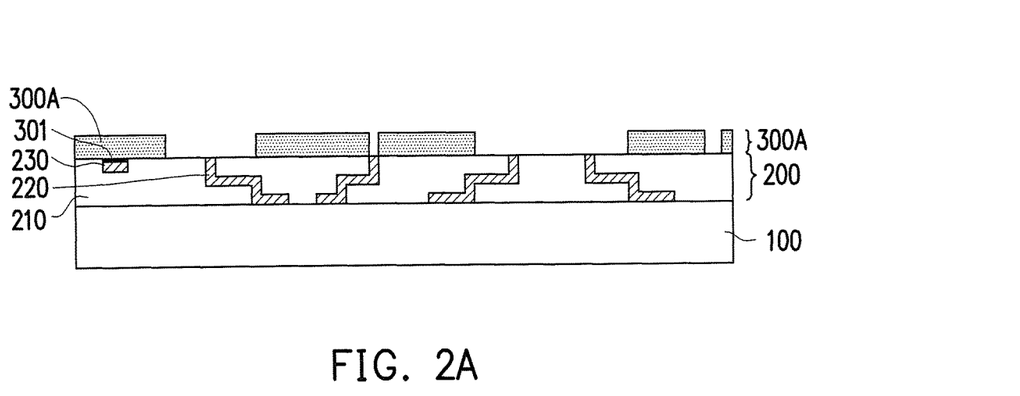
FIG. 2A to FIG. 2C are schematic cross-sectional diagrams of a manufacturing process of a power module according to another embodiment of the disclosure.
Figure 2B:
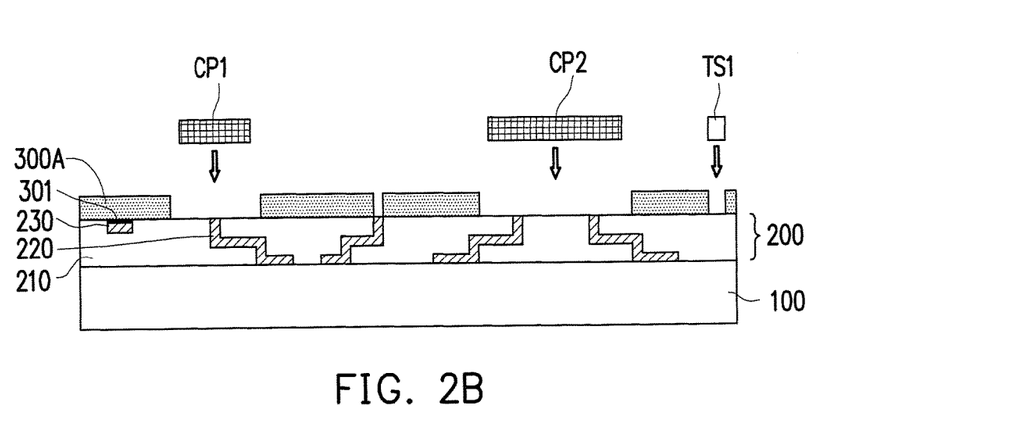
Figure 2C:
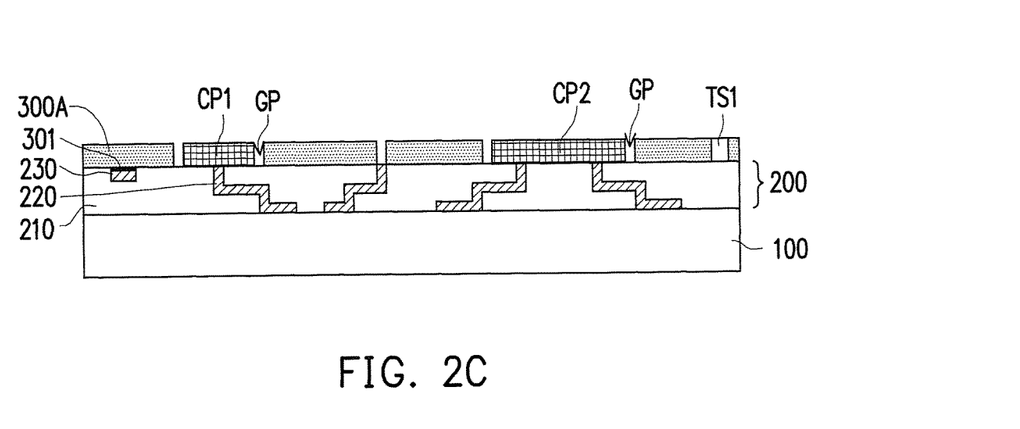

In the above embodiment, the ceramic bonding substrate 300A is formed on the interconnection layer 200 after disposing the first chip CP1 and the second chip CP2 on the interconnection layer 200. However, the disclosure is not limited thereto. For example, FIG. 2A to FIG. 2C are schematic cross-sectional diagrams of a manufacturing process of a power module according to another embodiment of the disclosure. The embodiment shown in FIG. 2A to FIG. 2C is similar to the embodiment shown in FIG. 1A to 1F, therefore, the same reference numerals are used to denote same or like parts, and its description thereof will not be repeated. The differences between the embodiments are explained below. Please refer to FIG. 2A, a ceramic bonding substrate 300A with several openings is formed on the interconnection layer 200. The bottom surface of the ceramic bonding substrate 300A is partially disposed with a metal bonding layer 301. The ceramic bonding substrate 300A is formed on the interconnection layer 200, and is connected to the interconnection layer 200 through the metal bonding layer 301. Next, referring to FIG. 2B to FIG. 2C, the first chip CP1 and the second chip CP2 are disposed on the interconnection layer 200, wherein the first chip CP1 and the second chip CP2 are buried within an opening formed by the ceramic bonding substrate 300A and the interconnection layer 200. In other words, in the embodiment shown in FIG. 2A to FIG. 2C, the first chip CP1 and the second chip CP2 are disposed on the interconnection layer 200 after forming the ceramic bonding substrate 300A on the interconnection layer 200. Subsequently, the method for completing the formation of a power module can be referred to the steps shown in FIG. 1E to FIG. 1F, so as to form the power module 10A in an embodiment of the disclosure.

Figure 3A:
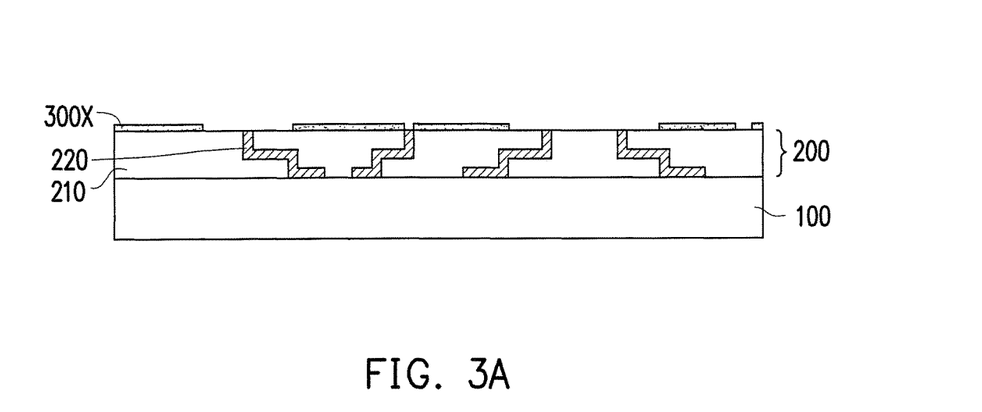
FIG. 3A to FIG. 3B are schematic cross-sectional diagrams of a manufacturing process of a power module according to another embodiment of the disclosure.
Figure 3B:
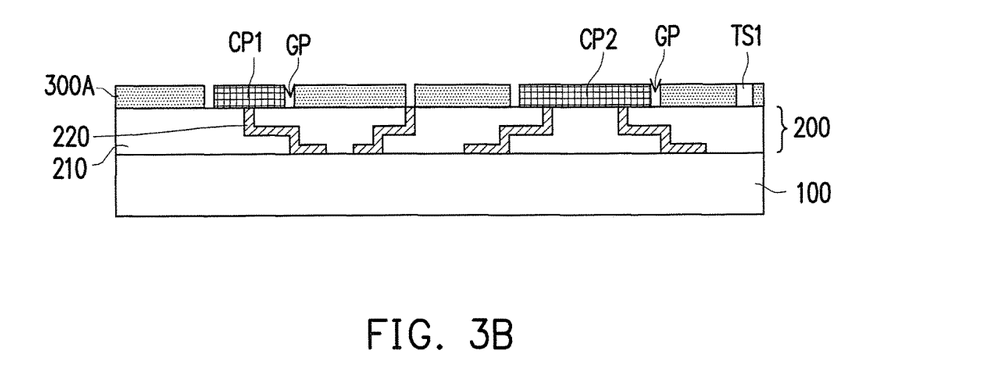

FIG. 3A to FIG. 3B are schematic cross-sectional diagrams of a manufacturing process of a power module according to another embodiment of the disclosure. The embodiment shown in FIG. 3A to FIG. 3B is similar to the embodiment shown in FIG. 1A to 1F, therefore, the same reference numerals are used to denote same or like parts, and its description thereof will not be repeated. The differences between the embodiments are explained below. As shown in FIG. 3A, a partially cured B stage resin material 300X having adhesion properties is formed on the interconnection layer 200. The B stage resin material 300X is formed at a region where the chips are not disposed. Next, in the step shown in FIG. 3B, the ceramic bonding substrate 300A is formed on the B stage resin material 300X. A hot press and curing step was then performed so as to connect the ceramic bonding substrate 300A to the interconnection layer 200 through the B stage resin material 300X. Thereafter, the first chip CP1 and the second chip CP2 are disposed in an opening formed by the ceramic bonding substrate 300A and the interconnection layer 200. Moreover, a temperature sensor TS1 or driving chips that are in other power modules may be disposed therein. The method for completing the formation of a power module can be referred to the steps shown in FIG. 1E to FIG. 1F, so as to form the power module in an embodiment of the disclosure. In the one embodiment, the ceramic bonding substrate 300A is directly formed on the interconnection layer 200 through pressing and curing steps, therefore, the metal bonding patterns and metal bonding layers are not required for providing connection.

Figure 4A:
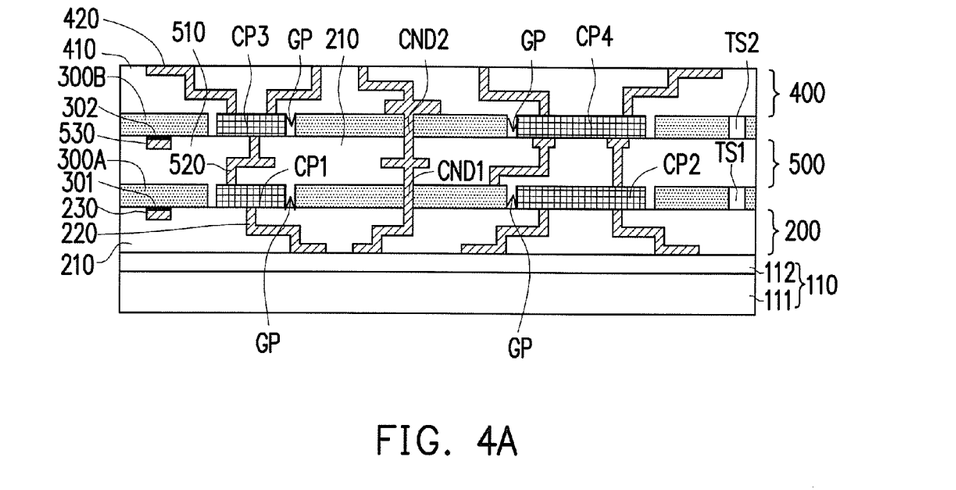
FIG. 4A to FIG. 4B are schematic cross-sectional diagrams of a manufacturing process of a power module according to another embodiment of the disclosure.
Figure 4B:
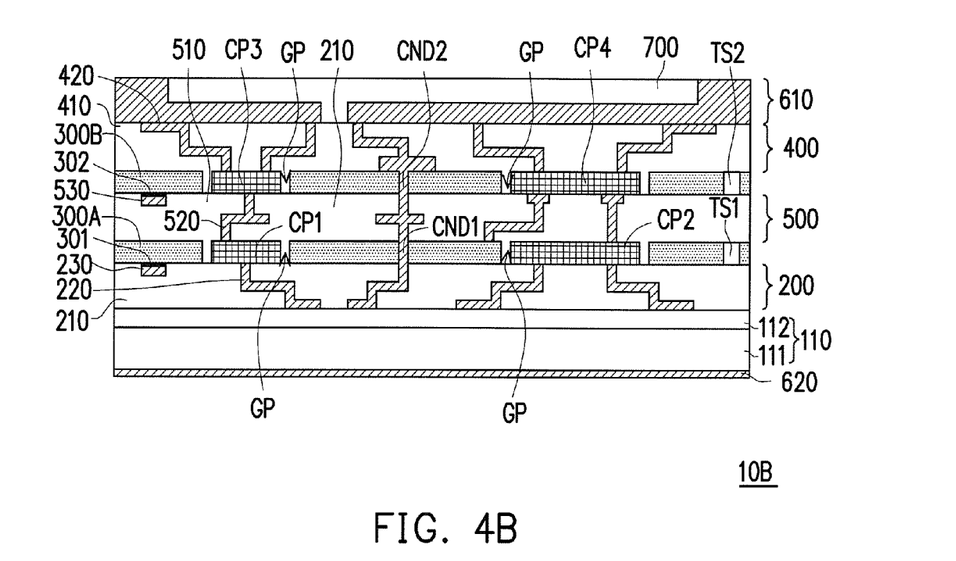

FIG. 4A to FIG. 4B are schematic cross-sectional diagrams of a manufacturing process of a power module according to another embodiment of the disclosure. Please refer to FIG. 4A, the carrier substrate 100 is a metal core substrate (for example, a metal core printed circuit board, MCPCB) 110. The metal core substrate 110 includes a metal core layer 111 and an insulating dielectric layer 112. The metal core layer 111 is used as a base, and a metal core layer material are metal materials having high heat transfer characteristics such as copper, aluminum and so forth. Furthermore, insulating (dielectric) materials, insulation thermal plastics, ABF and other materials are grown on the upper layer of the metal core layer 111 through methods such as pressing and coating so as to form the insulating dielectric layer 112. Thereafter, an interconnection layer 200 is formed on the carrier substrate 100 in the same way as shown in the embodiment of FIG. 1A. More specifically, the interconnection layer 200 can be used as a bottom interconnection layer, and includes an insulating layer 210 and a conductive patterned structure 220 that is located within the insulating layer 210. The conductive patterned structure 220 is, for example, materials with high thermal conductive properties such as copper. In addition, the surface of the interconnection layer 200 (bottom interconnection layer) has a metal bonding pattern 230.

Furthermore, a first chip CP1 (first bottom chip) and a second chip CP2 (second bottom chip) are disposed on the interconnection layer 200 (bottom interconnection layer), wherein the first chip CP1 and the second chip CP2 are electrically connected to the interconnection layer 200 (bottom interconnection layer). In particular, the conductive patterned structure 220 of the interconnection layer 200 extends from a position where the first chip CP1 and the second chip CP2 are disposed to another position that does not overlap with the position of the first chip CP1 and the second chip CP2. That is, the conductive patterned structure 220 extends to an outer side of the chip coverage area (footprint) of the first chip CP1 and the second chip CP2, such that the interconnection layer 200 is used as a redistribution layer. The first chip CP1 and the second chip CP2, for example, includes chips for a power module such as diodes, or insulated-gate bipolar transistors (IGBT), metal-oxide semiconductor field-effect transistor (MOSFET), or driving chips in other power modules, and so forth, but is not limited thereto. In the one embodiment, the conductive patterned structure 220 extends from a position where the first chip CP1 and the second chip CP2 are disposed to another position that does not overlap with the position of the first chip CP1 and the second chip CP2, such structure is known as a "Fan Out" structure. In addition, in the one embodiment, related sensors such as a temperature sensor TS1 may be optionally disposed on the interconnection layer 200, but is not limited thereto.

In the embodiment of FIG. 4A, the ceramic bonding substrate 300A can be used as the bottom ceramic bonding substrate, and is located above the interconnection layer 200 and disposed in between the first chip CP1 and the second chip CP2 so as to separate the first chip CP1 from the second chip CP2. The ceramic bonding substrate 300A includes electrically insulating materials such as $Al_2O_3$, GaN, SiC, MN, BeO, and so forth, but is not limited thereto. In the one embodiment, the bottom surface of the ceramic bonding substrate 300A is partially disposed with a metal bonding layer 301. The ceramic bonding substrate 300A is connected to the metal bonding pattern 230 of the interconnection layer 200 through the metal bonding layer 301.

In addition, the first interconnection layer 500 is disposed on the ceramic bonding substrate 300A, the first chip CP1 (first bottom chip) and the second chip CP2 (second bottom chip). In other words, the first interconnection layer 500 is formed above the interconnection layer 200 (bottom interconnection layer) and the ceramic bonding substrate 300A (bottom ceramic bonding substrate). A gap GP exists in between the first chip CP1 and the ceramic bonding substrate 300A and in between the second chip CP2 and the ceramic bonding substrate 300A, respectively. The first interconnection layer 500 includes an insulating layer 510 and a conductive patterned structure 520 located within the insulating layer 510, wherein the insulating layer 510 fills into the gap GP. Furthermore, the manufacturing method of a power module in the embodiment further includes forming a conductive structure CND1 within the ceramic bonding substrate 300A. The conductive structure CND1 is electrically connected to the interconnection layer 200 and the first interconnection layer 500 respectively. The material, structure and positioning relationship of the first interconnection layer 500 is the same as that defined for the interconnection layer 200, and its description thereof will not be repeated. In the next step, a ceramic bonding substrate 300B, a chip CP3 (same as first chip CP1), a chip CP4 (same as second chip CP2) and a top interconnection layer 400 can be formed on the first interconnection layer 500 by referring to the steps shown in the embodiment of FIG. 1C to FIG. 1F. In the one embodiment, the interconnection layer 200 is used as the bottom interconnection layer, and in between the interconnection layer 200 and the top interconnection layer 400, single layer of the first interconnection layer 500 exists. However, the disclosure is not limited thereto. For example, in other embodiments, multiple interconnection layers may be disposed in between the interconnection layer 200 (bottom interconnection layer) and the top interconnection layer 400.

Referring to FIG. 4B, a lead frame 610 is formed on the top interconnection layer 400, wherein the lead frame 610 is electrically connected to the top interconnection layer 400. After completing the above process, a molding material is formed on the lead frame 610 to form a molding material layer 700 and a mold cutting process of the molding material is performed so as to form the power module of the embodiment. Since the embodiment uses a metal core substrate 110 with greater thickness as the carrier substrate, the structure can be used to further improve the heat dissipation ability of the power module. By using the method described above, a power module 10B according to another embodiment of the disclosure as shown in FIG. 4B can be formed. Similarly, the structure design of the power module 10B can significantly improve the heat dissipation of the power module, thereby enabling the heat transmission distance to be shortened, and to enhance the heat dissipation effect.

In summary, the power module and the manufacturing method thereof in the disclosure uses the ceramic bonding substrate and the interconnection layers to provide opening structures that can be used to fix the position of each chip. The interconnection layer includes an insulating layer and a conductive patterned structure located within the insulating layer so as to transmit electrical signals. As such, the power module can be made thinner, and a heat and electrical transmission distance can be reduced.

In addition, since the conductive patterned structure of the interconnection layer extends from a position where the first chip and the second chip are disposed to another position that does not overlap with the position of the first chip and the second chip, that is, the conductive patterned structure extends to an outer side of the chip coverage area (footprint) of the first chip and the second chip, therefore, the interconnection layer can be used as a redistribution layer. Similarly, in another embodiment, since the conductive patterned structure of the bottom interconnection layer extends from a position where the first bottom chip and the second bottom chip are disposed to another position that does not overlap with the position of the first bottom chip and the second bottom chip, that is, the conductive patterned structure extends to an outer side of the chip coverage area (footprint) of the first bottom chip and the second bottom chip, therefore, the bottom interconnection layer can be used as a redistribution layer. Such structure designs can be used to improve the packaging yield as well as for reducing a short-circuit problem of the contact points between the chips of the interconnection layer.

It will be apparent to those skilled in the art that various modifications and variations can be made to the structure of the disclosure embodiments without departing from the scope or spirit of the disclosure. In view of the foregoing, it is intended that the disclosure cover modifications and variations of this disclosure provided they fall within the scope of the following claims and their equivalents.

What is claimed is:

1. A power module, comprising:
   a carrier substrate;
   an interconnection layer, disposed on the carrier substrate, wherein the interconnection layer comprises an insulating layer and a conductive patterned structure located within the insulating layer;
   a first chip and a second chip, disposed on the interconnection layer, wherein the first chip and the second chip are electrically connected to the interconnection layer, and the conductive patterned structure of the interconnection layer extends from a position where the first chip and the second chip are disposed to another position that does not overlap with the position of the first chip and the second chip, such that the conductive patterned structure is extended to outside of an outline of the first chip and the second chip, and used as a redistribution layer, and the first chip is a power chip;
   a ceramic bonding substrate, disposed on the interconnection layer and disposed in between the first chip and the second chip so as to separate the first chip from the second chip;
   a top interconnection layer, disposed on the ceramic bonding substrate and covers the first chip and the second chip, wherein the top interconnection layer is electrically connected to the first chip and the second chip;

a lead frame, disposed on the top interconnection layer and electrically connected to the top interconnection layer; and a molding material layer, disposed on the lead frame.

2. The power module according to claim 1, further comprising a conductive structure penetrating the ceramic bonding substrate, wherein the conductive structure is electrically connected to the interconnection layer and the top interconnection layer respectively.

3. The power module according to claim 1, wherein:

a gap exists in between the first chip and the ceramic bonding substrate and in between the second chip and the ceramic bonding substrate respectively, and the top interconnection layer further comprises an insulating layer and a conductive patterned structure located within the insulating layer, wherein the insulating layer fills into the gap.

4. The power module according to claim 1, further comprising a heat dissipation metal layer disposed on a bottom surface of the carrier substrate.

5. A power module, comprising:

a carrier substrate;

a bottom interconnection layer, disposed on the carrier substrate;

a first bottom chip and a second bottom chip, disposed on the bottom interconnection layer, wherein the first bottom chip and the second bottom chip are electrically connected to the bottom interconnection layer; and a bottom ceramic bonding substrate, disposed on the bottom interconnection layer and disposed in between the first bottom chip and the second bottom chip so as to separate the first bottom chip from the second bottom chip, and a first interconnection layer disposed on the bottom ceramic bonding substrate, the first bottom chip and the second bottom chip;

an interconnection layer, disposed on the carrier substrate;

a first chip and a second chip, disposed on the interconnection layer, wherein the first chip and the second chip are electrically connected to the interconnection layer;

a ceramic bonding substrate, disposed on the interconnection layer and disposed in between the first chip and the second chip so as to separate the first chip from the second chip;

a top interconnection layer, disposed on the ceramic bonding substrate and covers the first chip and the second chip, wherein the top interconnection layer is electrically connected to the first chip and the second chip;

a lead frame, disposed on the top interconnection layer and electrically connected to the top interconnection layer; and a molding material layer, disposed on the lead frame.

6. The power module according to claim 5, wherein the carrier substrate is a metal core substrate, and the metal core substrate comprises a metal core layer and an insulating dielectric layer.

7. The power module according to claim 5, further comprising a conductive structure penetrating through the bottom ceramic bonding substrate, wherein the conductive structure is electrically connected to the bottom interconnection layer and the first interconnection layer respectively.

8. The power module according to claim 5, wherein:

a gap exists in between the first bottom chip and the bottom ceramic bonding substrate and in between the second bottom chip and the bottom ceramic bonding substrate respectively, and the first interconnection layer comprises an insulating layer and a conductive patterned structure located within the insulating layer, wherein the insulating layer fills into the gap.

9. A package structure, comprising:

a carrier substrate;

an interconnection layer, disposed on the carrier substrate, wherein the interconnection layer comprises an insulating layer and a conductive patterned structure located within the insulating layer; and a first chip and a second chip, disposed on the interconnection layer, wherein the first chip and the second chip are electrically connected to the interconnection layer, and the conductive patterned structure of the interconnection layer at least extends from a position where the first chip or the second chip is disposed to another position that does not overlap with the position of the first chip or the second chip, such that the conductive patterned structure is extended to outside of an outline of the first chip or the second chip, and used as a redistribution layer, and the first chip is a power chip.

10. The package structure according to claim 9, further comprising:

a ceramic bonding substrate, disposed on the interconnection layer and disposed in between the first chip and the second chip so as to separate the first chip from the second chip.

11. The package structure according to claim 10, further comprising:

a top interconnection layer, disposed on the ceramic bonding substrate and covering the first chip and the second chip, wherein the top interconnection layer is electrically connected to the first chip and the second chip.

12. The package structure according to claim 11, further comprising a lead frame, disposed on the top interconnection layer and electrically connected to the top interconnection layer; and a molding material layer, disposed on the lead frame.

13. The package structure according to claim 11, further comprising a conductive structure penetrating the ceramic bonding substrate, wherein the conductive structure is electrically connected to the interconnection layer and the top interconnection layer respectively.

14. The package structure according to claim 11, wherein:

a gap exists in between the first chip and the ceramic bonding substrate and in between the second chip and the ceramic bonding substrate respectively, and the top interconnection layer further comprises an insulating layer and a conductive patterned structure located within the insulating layer, wherein the insulating layer fills into the gap.

15. The package structure according to claim 9, further comprising:

a bottom interconnection layer, disposed on the carrier substrate;

a first bottom chip and a second bottom chip, disposed on the bottom interconnection layer, wherein the first bottom chip and the second bottom chip are electrically connected to the bottom interconnection layer; and a bottom ceramic bonding substrate, disposed on the bottom interconnection layer and disposed in between the first bottom chip and the second bottom chip so as to separate the first bottom chip from the second bottom chip, and a first interconnection layer disposed on the bottom ceramic bonding substrate, the first bottom chip and the second bottom chip.

\* \* \* \* \*